United States Patent [19]

Bergmann

[11] Patent Number: 5,241,552
[45] Date of Patent: Aug. 31, 1993

[54] COMPENSATED LASER STRUCTURE FOR ANALOG COMMUNICATION APPLICATIONS

[75] Inventor: Ernest E. Bergmann, Fountain Hill Borough

[73] Assignee: AT&T Bell Laboratories, Murray Hill, N.J.

[21] Appl. No.: 781,540

[22] Filed: Oct. 22, 1991

[51] Int. Cl.⁵ .............................................. H01S 3/19
[52] U.S. Cl. ...................................... 372/38; 372/46
[58] Field of Search ................... 372/38, 29, 44, 45, 372/46

[56] References Cited

U.S. PATENT DOCUMENTS

| | | | |
|---|---|---|---|
| 4,101,847 | 7/1978 | Albanese | 331/94.5 |
| 5,012,484 | 4/1991 | Flynn et al. | 372/96 |
| 5,020,049 | 5/1991 | Bodeep et al. | 370/3 |
| 5,034,334 | 7/1991 | Flynn et al. | 437/8 |

*Primary Examiner*—James W. Davie
*Attorney, Agent, or Firm*—Wendy W. Koba

[57] ABSTRACT

A laser diode structure including compensating elements for improving the linearity of the laser response, of particular concern for broadband analog applications. The compensation comprises voltage-dependent elements which are incorporated to correct for the presence of parasitic, voltage-dependent resistive and capacitive elements associated with the laser diode junction. These parasitic elements have been found to be a cause of the laser's nonlinear L-I relationship. By careful choice of the bias voltages supplied to the compensating elements, the nonlinearity due to the presence of the parasitic elements may be minimized. In particular, a combination of a voltage-dependent resistance and voltage-dependent capacitance may be utilized.

11 Claims, 3 Drawing Sheets

COMPENSATED LASER STRUCTURE FOR ANALOG COMMUNICATION APPLICATIONS

BACKGROUND OF THE INVENTION

1. Technical Field

The present invention relates to a semiconductor laser diode structure and, more particularly, to a laser diode structure which includes compensation for voltage-dependent parasitics associated with the laser diode junction.

2. Description of the Prior Art

The concept of transmitting several television channels over a single-mode optical fiber via analog intensity modulation of a semiconductor laser diode has been receiving considerable attention. As proposed in the prior art, an arrangement would transmit multi-channel amplitude modulated vestigial side-band (AM-VSB) signals, as used in present day common antenna (i.e., cable) television (CATV) systems, in an optical fiber transmission media. Such an arrangement would be useful in a CATV trunk system, a fiber-to-the-home network, or the like. Optical fiber transmission systems that use frequency division multiplexing overcome compatibility problems and have advantages such as simplicity of design, reduced bandwidth requirements for lightwave components, and much lower cost, as compared with optical time division multiplex (TDM) systems.

The low loss of optical fibers make analog sub-carrier modulation an attractive technology. Several signals at different sub-carrier frequencies, each signal representing one of the analog/data channels to be multiplexed, are summed and applied concurrently to the input of the laser device. The resulting laser drive current is a dc bias level plus the set of sub-carrier signals. For the laser, the magnitude of the optical output power from the laser is an approximately linear function of its drive current. The resulting sub-carrier frequency-division multiplexed (FDM) output signal is applied to an optical fiber for transmission over an extended distance.

Multi-channel signal transmission requires special limitations on the power, linearity and intensity noise of the transmitting laser diode. For adequate system performance, the laser output light intensity must be a linear function of its drive current. Strict limitations on laser diode linearity are required, for example, because of the wide dynamic range of the National Television Systems Committee (NTSC) standard video format. Lasers with fairly linear characteristics are available with composite second and third harmonic distortion down to −30 dBc and −40 dBc, respectively, from the relevant carrier fundamental for acceptable levels of input modulation current. In that NTSC standard video format, the ratio of the magnitude of the total composite of the third order intermodulation distortion products at the carrier frequency to the magnitude of the carrier must be less than approximately −60 dBc. Similarly, the composite second-order (CSO) distortion, i.e., the sum of several tens of two-tone products (or the ratio of the largest composite second-order peak to the carrier), must be less than approximately −50 dBc. This low distortion must be obtained when the laser is modulated with an optical modulation depth of typically one to ten percent per channel, to insure acceptable carrier-to-noise performance.

To obtain such high signal quality in view of the large number of distortion products, the transmitting laser light power versus drive current characteristic curve must be extremely linear. There are several known causes of nonlinearity in semiconductor laser diodes. Some of the causes are high frequency relaxation oscillations, low frequency heating effects, damping mechanisms, such as gain compression and nonlinear absorption, and leakage current. The resulting effect of the distortion is interference in each of the signals, due to the presence of the remaining signals.

Various methods have been used in the past to control the linearity of laser diodes for analog modulation applications. U.S. Pat. No. 4,101,847 issued to A. Albanese on Jul. 18, 1978 discloses a control circuit which automatically adjusts the operating current level of a laser diode to maintain linearity of the output. In particular, a test signal is used to modulate the laser and the operating current level is adjusted until the harmonic distortion component at twice the test signal frequency (i.e., second-order harmonic) is minimized. In an alternative technique, U.S. Pat. No. 5,012,484 issued to E. J. Flynn et al. on Apr. 30, 1991 teaches a laser diode device fabricated to produce a non-uniform photon density in the laser cavity, with the density of photons being larger in the rear portion of the cavity than in the front portion. During the operation of the laser, the gain in the back portion is therefore substantially independent of the laser current, whereas the gain in the front portion is a function of the laser current. The non-uniformity results in a greater likelihood that the best operating current level will be substantially greater than the threshold current, with a concomitant higher output power.

As mentioned above, one source of laser nonlinearity is the leakage current present around the active region of the laser diode structure. U.S. Pat. No. 5,020,049 issued to G. E. Bodeep et al. on May 28, 1991 discloses a technique for providing a laser diode with a relatively low leakage current (and hence, relatively linear response) by operating the laser diode at a bias current level associated with the point of inflection of the L-I curve (output power vs. operating current). Operation with the laser biased at or near this point results in extremely linear performance, even though the laser may have insufficient blocking of leakage current to otherwise produce acceptable linearity.

A remaining issue in the area of laser diode nonlinearity is that there appears to be a relatively small acceptable operating current range which provides the required linear relationship. Prior art techniques thus address various means of controlling the operation of the laser to remain in the vicinity of the optimum bias current and often limit the number of fabricated lasers which meet the requisite criteria. A need remains, therefore, for a means of improving the inherent linearity of the laser diode such that controls as those of the prior art are not required.

SUMMARY OF THE INVENTION

The need remaining in the prior art is addressed by the present invention which relates to a semiconductor laser diode structure and, more particularly, to a laser diode structure which includes compensation for voltage-dependent intrinsic parasitics associated with the laser diode junction. The compensation comprises voltage-dependent elements formed to essentially match the intrinsic parasitic components and thus maintain a substantially linear relationship between the applied operating current and the output power from the laser.

In accordance with the teachings of the present invention, a compensating voltage-dependent structure is utilized which allows the current passing through the active region of a laser diode to more closely track the applied operating current. It has been discovered that as the operating current increases, a greater portion is redirected into the associated parasitic elements (i.e., as leakage current). As a result, the voltage developed across the active region of the diode (and, therefore the output power of the diode) does not track the increase in operating current. The compensating structure of the present invention is formed to balance the parasitic load such that the leakage current is maintained at a relatively constant percentage of the applied operating current, allowing the voltage across the laser diode (and resultant output power) to exhibit an essentially linear relationship with the operating current.

For a particular embodiment of the present invention, the compensating nonlinear structure may comprise a voltage-dependent conductance which is biased to essentially match the voltage-dependent change in junction conductance associated with the laser diode. In an alternative embodiment, the compensating nonlinear structure may comprise a voltage-dependent capacitance which is biased to essentially match the voltage-dependent change in junction capacitance associated with the laser diode. The preferred embodiment comprises both a voltage-dependent compensating conductance and a voltage-dependent compensating capacitance.

An advantage of the structure of the present invention is that the compensating structure may be integrated within the same semiconductor material as the laser diode structure (i.e., on the same chip). Thus, the compensation will track the laser with respect to changes in operating conditions such as, for example, temperature fluctuations, laser aging, or the like.

Other and further advantages of the present invention will become apparent during the course of the following discussion and by reference to the accompanying drawings.

BRIEF DESCRIPTION OF THE DRAWING

Referring now to the drawings.

DETAILED DESCRIPTION

Figure 1:
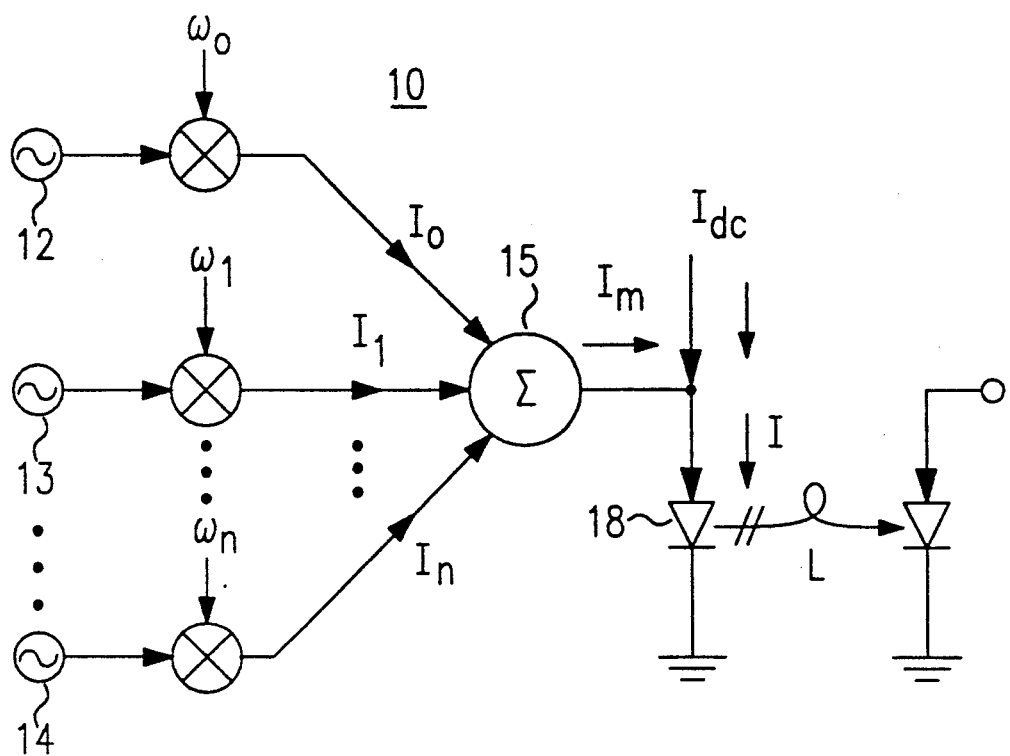
FIG. 1 contains a block diagram of an exemplary sub-carrier multiplexed optical transmission system.

Referring now to FIG. 1, there is shown a sub-carrier multiplexed optical transmission system 10. Several baseband frequency modulated signals 12, 13, ..., 14 are frequency division multiplexed on different carrier frequencies $\omega_0, \omega_1, \ldots \omega_n$, as separate sub-carriers $I_0, I_1, \ldots, I_n$, respectively. A summing element 15 combines the individual signals at the different sub-carrier frequencies into a multiplexed input signal $I_m$. This multiplexed input signal $I_m$ is applied to a laser diode 18 as a part of a total laser drive current I.

The total drive current, or injection current, to laser diode 18 includes both a dc bias current $I_{dc}$ and the composite multiplexed input signal $I_m$ from summing element 15. The number of signals in the laser drive current may be as many as eighty or more bands of frequencies throughout a range of frequencies from 1 MHz to over 1 GHz. For a perfectly linear laser, its output optical signal power L varies directly with the applied laser drive current.

Figure 2:
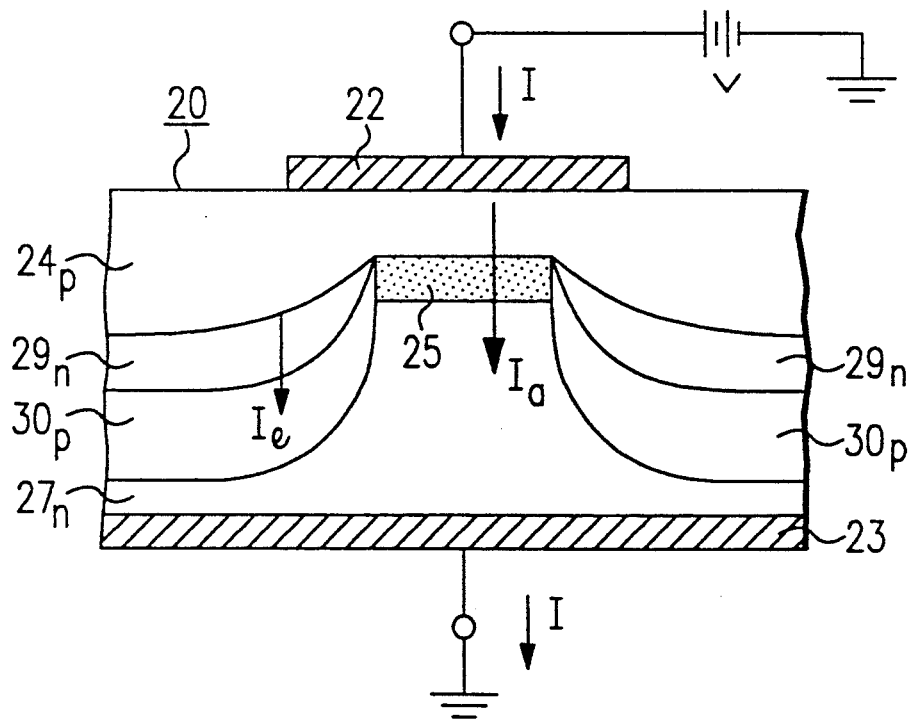
FIG. 2 is a structural and schematic diagram of an exemplary laser diode arrangement, illustrating in particular the presence of a leakage current path through the arrangement.

Referring now to FIG. 2, there is shown a cross section of either an etched-mesa buried-heterostructure (EMBH) or double-channel planar-buried-heterostructure (DCPBH) laser diode 20 which is designed to limit leakage current to a very low level. The laser diode 20 includes metallic contacts 22 and 23. A p-type embedding layer 24 spans the entire laser diode. An active layer 25 is positioned on top of a stripe mesa of n-type substrate 27. An n-type current confining layer 29 and a p-type current blocking layer 30 are formed adjacent to and on both sides of mesa 27.

During operation, the total laser drive current I is conducted into and out of the device by way of leads connected to the metallic contacts 22 and 23. Illustratively, the operating voltage across laser diode 20 is shown as a supply voltage V connected between ground and the metallic contact 22. Contact 23 is connected with ground. Current $I_a$ represents all of the current conducted through active layer 25. Leakage current $I_l$ is limited by confining most of the total drive current I to the active region via a p-n-p-n structure on both sides of the active-stripe mesa (other current blocking structures are possible). The p-n-p-n structure has been described previously in an article by I. Mito et al., appearing in the *Journal of Lightwave Technology*, Vol. LT-1, March 1983 at pages 195-202 and is incorporated herein by reference.

Figure 3:
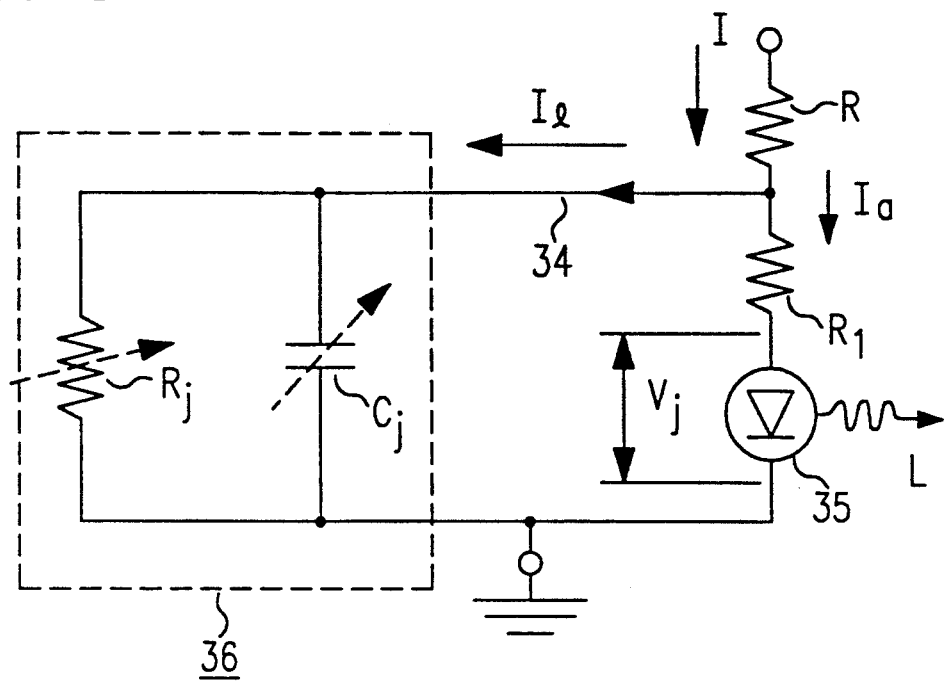
FIG. 3 is a schematic diagram of a model of a laser diode operating in the system of FIG. 1, illustrating in particular the parasitic components of the leakage path.

FIG. 3 illustrates a circuit model which represents the operation of laser diode 20 of FIG. 2, for the range of drive currents of interest for multiplexing several signals together. In FIG. 3, resistance R represents a contact resistance, which is the equivalent resistance located in a region between metallic contact 22 and a part of the p-type material 24 (see FIG. 2). In FIG. 3, a resistor $R_1$ represents the resistance in p-type material 24 just above active layer 25. A diode symbol 35 represents the operative active layer 25. A branch 34 of the circuit model represents leakage current operations. It has been discovered that the leakage current element 36 associated with the laser junction may be modeled as a junction resistance $R_j$ and a junction capacitance $C_j$ disposed in parallel across active layer 25, where the values of $R_j$ and $C_j$ are voltage-dependent and change with an increasing drive current I such that the leakage current $I_l$ becomes an increasingly larger percentage of the total drive current. This "spillover" of leakage current thus reduces the current $I_a$ directed applied to active region 35 of the laser diode for large levels of drive current, and results in the light output L becoming a nonlinear function of the drive current.

Figure 4:
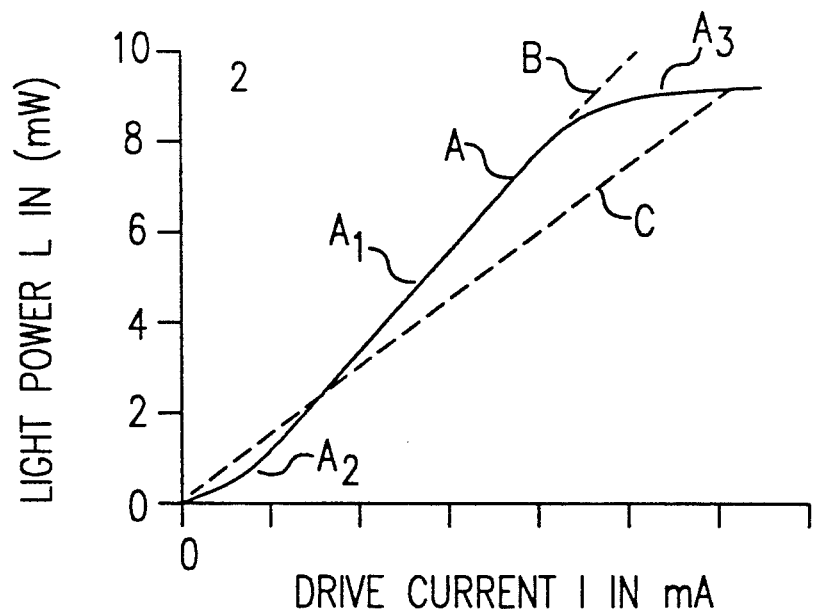
FIG. 4 is a differentiated light power versus drive current characteristic for an exemplary laser diode as modeled in FIG. 3.

FIG. 4 contains a generalized graph of light output power L from a laser diode as a function of the magnitude of the drive current I applied as an input thereto. Curve A represents the actual L-I relationship, which may be characterized as including a relatively linear portion $A_1$ (associated with conventional values of drive current I), a superlinear portion $A_2$ (associated with relatively low values of drive current I), and a sublinear portion $A_3$ (associated with relatively high values of drive current I, where the presence of leakage current $I_l$ becomes significant). Ideally, the light output L should remain a linear function of the drive current I, as represented by curve B in FIG. 4. However, it has been discovered that the presence of the parasitic resistance $R_j$ contributes significantly to the sublinear portion $A_3$ of the L-I curve by exhibiting a steeply rising conductance with an increase in the applied voltage $V_j$. Therefore, in accordance with the teachings of the present invention, a compensating voltage-dependent resistance (conductance) is incorporated into the laser structure to counteract the rising conductance associated with junction resistance $R_j$.

Figure 5:
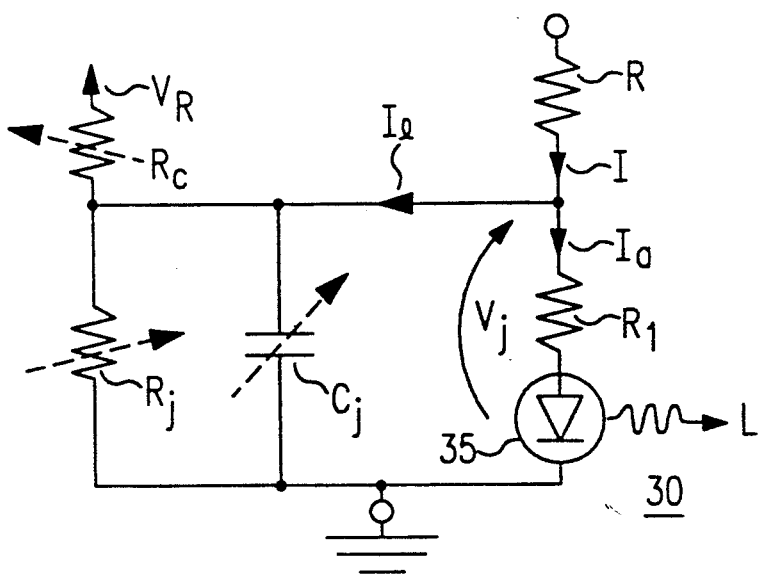
FIG. 5 illustrates an exemplary compensated laser structure in accordance with the teachings of the present invention, utilizing a voltage-dependent resistance element.

FIG. 5 illustrates an exemplary compensated laser diode structure 30 including a compensating voltage-dependent resistance $R_c$. Resistance $R_c$ is biased by a voltage source $V_R$. Therefore, as $V_j$ increases, due to an increase in drive current I, the difference voltage $V_R - V_j$ decreases. As a result, the combined value of parasitic resistance $R_j$ and compensating resistance $R_c$ will retain relatively constant and the light output L will remain an essentially linear relationship with the drive current I. In other words, the compensating resistance is chosen such that its differential conductance (with respect to changes in voltage) is essentially matched to the differential conductance of parasitic resistance $R_j$. Curve C of FIG. 4 illustrates the relationship between drive current I and light output L for compensated structure 30 of FIG. 5. Although the overall output power L is less than the uncompensated arrangement (curve A), a linear relationship is maintained.

Figure 6:
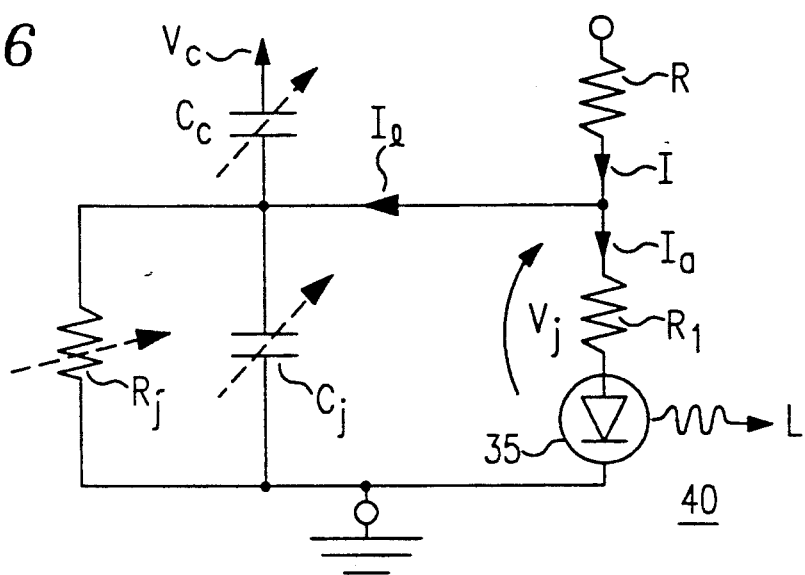
FIG. 6 illustrates an alternative compensated laser structure of the present invention, utilizing a voltage-dependent capacitance element.

Fluctuations in the value of the junction capacitance $C_j$ as a function of changes in drive current I are also responsible for nonlinearities in the light output L from the laser diode and are considered to significantly contribute to the composite second order (CSO) distortion of lasers used in broadband applications such as CATV. In accordance with the teachings of the present invention, these fluctuations may be minimized by including a compensating, voltage-dependent capacitance within the laser structure. FIG. 6 illustrates an exemplary compensated laser diode structure 40 including a voltage-dependent capacitance $C_c$. Capacitance $C_c$ is included to negate the presence of voltage-dependent junction capacitance $C_j$. A bias voltage $V_C$ is applied to compensating capacitance $C_c$ such that the differential values of capacitance $C_j$ and $C_c$ (with respect to voltage) are essentially equal. Therefore, relatively little increase in the parasitic conductance and reactance will be observed, and the output light L from active region 35 will remain an essentially linear function of drive current I.

Figure 7:
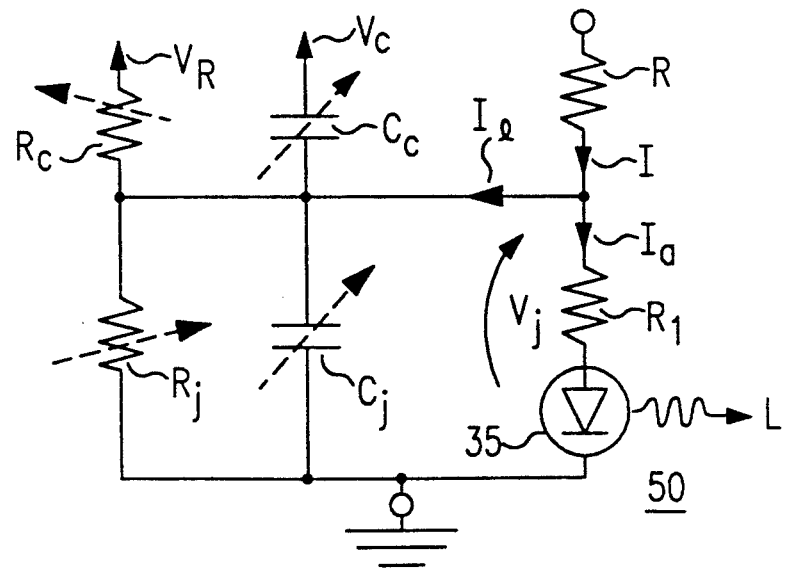
FIG. 7 illustrates a preferred embodiment of a compensated laser diode formed in accordance with the teachings of the present invention, incorporating both a compensating resistance element and compensating capacitance element.

The preferred embodiment of the present invention, as mentioned above, is one which incorporates both a voltage-dependent resistance and a voltage-dependent capacitance into the compensated laser structure. FIG. 7 illustrates an exemplary laser diode structure 50 of this preferred embodiment. As shown, structure 50 includes both a compensating voltage-dependent resistance $R_c$ and a compensating voltage-dependent capacitance $C_c$. As discussed above, these elements are biased at values of $V_R$ and $V_C$, respectively. Therefore, if the differential conductance of parasitic junction resistance $R_j$ and the differential conductance of compensating resistance $R_c$ are not completely matched, the value of $V_R$ may be adjusted until the distortion in the light output reaches a minimum value. Similarly, bias voltage $V_C$ may be adjusted to provide matching of the differential values of junction capacitance $C_j$ and compensating capacitance $C_c$. Ideally, if symmetry is achieved where $R_j = R_c$ and $C_j = C_c$, then $V_R = V_C = 2 V_j$.

I claim:

1. In a laser diode structure for providing light output (L) in response to an applied drive current (I), wherein said laser diode structure includes voltage-dependent intrinsic parasitic components inherent within the laser diode junction, compensating means for maintaining a substantially linear relationship between said light output and said applied drive current, said compensating means coupled across said laser diode and comprising at least one voltage-dependent element for essentially matching changes in said voltage-dependent intrinsic parasitic components.

2. Compensating means for a laser diode structure as defined in claim 1 wherein the laser diode intrinsic voltage-dependent parasitic components include a voltage-dependent junction resistance with a conductance that increases for an increasing drive current, said compensating means comprising a voltage-dependent compensating resistance biased at a predetermined value $V_R$ such that as the voltage $V_j$ across said laser diode junction increases, the value $V_R - V_j$ decreases to maintain an essentially constant combined resistance of said laser diode junction resistance and said voltage-dependent compensating resistance, independent of changes in the drive current.

3. Compensating means for a laser diode structure as defined in claim 1 wherein the laser diode intrinsic voltage-dependent parasitic components include a voltage-dependent junction capacitance which changes in value for an increasing drive current, said compensating means comprising a voltage dependent compensating capacitance biased at a predetermined value $V_C$ so as to essentially negate the presence of said parasitic voltage-dependent capacitance and maintain an essentially constant combined capacitance, independent of changes in the drive current.

4. Compensating means for a laser diode structure as defined in claim 1 wherein the laser diode intrinsic voltage-dependent parasitic components include a voltage-dependent junction resistance and a voltage-dependent junction capacitance, said compensating means comprising a voltage-dependent compensating resistance and a voltage-dependent compensating capacitance, said compensating means biased so as to provide a voltage-dependent element which, in combination with said voltage-dependent parasitic components, maintains an essentially linear relationship between the applied drive current and the light output from said laser diode.

5. In a sub-carrier multiplex transmission system
means for frequency division multiplexing a plurality of signals into a multiplexed input signal;
means for supplying a dc bias current;
means for combining said dc bias current and said multiplexed input signal into a laser drive current; and
a semiconductor laser, including voltage-dependent parasitic components inherent within the laser diode junction, said semiconductor laser responsive to said laser drive current, for producing an optical output including said plurality of signals, said optical output being a substantially linear function of said laser drive current and said semiconductor laser including compensating means for maintaining a substantially linear relationship between said optical output and said drive current, said compensating means coupled across said laser diode and comprising at least one voltage-dependent element for essentially matching the voltage-dependent changes in said voltage-dependent parasitic components.

6. In a sub-carrier multiplex transmission system as defined in claim 5 the semiconductor laser voltage-dependent parasitic components including a voltage-dependent junction resistance and voltage dependent junction capacitance, the compensating means including a voltage-dependent compensating resistance and voltage-dependent compensating capacitance biased to as to provide a voltage-dependent element which, in combination with said parasitic components, maintains a substantially linear relationship between the drive current to and the optical output from said semiconductor laser.

7. A laser diode structure responsive to a drive current (I) having both a dc component ($I_{dc}$) and a modulating component ($I_m$), said laser diode structure including
an active region capable of providing an optical output signal (L) in response to a current ($I_a$) passing therethrough;
current blocking means including intrinsic voltage-dependent parasitic elements, said current blocking means disposed contiguous to the active region so as to provide confinement of said drive current to said active region, said drive current characterized by said active region current ($I_a$) and a leakage current ($I_l$) directed through said current blocking means, where $I_a + I_l$ is essentially equal to I; and
compensating means for limiting said leakage current passing through said current blocking means to a relatively constant percentage of said drive current, independent of the magnitude of said drive current, said compensating means comprising voltage-dependent elements disposed across said current blocking means and characterized to track voltage-dependent changes in said intrinsic parasitic elements of said current blocking means and maintain a substantially linear relationship between said drive current and said optical output signal.

8. A laser diode structure as defined in claim 7 wherein the current blocking means is characterized as comprising a voltage-dependent parasitic resistance element and a voltage-dependent parasitic capacitance element.

9. A laser diode structure as defined in claim 8 wherein the compensating means comprises a voltage-dependent resistance element biased at a predetermined value $V_R$ such that as the voltage $V_j$ across the laser diode active region increases, the value $V_R - V_j$ decreases to maintain an essentially constant combined resistance, independent of changes in the drive current.

10. A laser diode structure as defined in claim 8 wherein the compensating means comprises a voltage-dependent capacitance element biased at a value $V_C$ so as to essentially negate the presence of the parasitic voltage-dependent capacitance and maintain an essentially constant combined capacitance, independent of changes in the drive current.

11. A laser diode structure as defined in claim 8 wherein the compensating means comprises
a voltage-dependent resistance element biased at a predetermined value $V_R$ such that as the voltage $V_j$ across the laser diode active region increases, the value $V_R - V_j$ decreases; and
a voltage-dependent capacitance element biased at a predetermined value $V_C$ so as to essentially negate the presence of the parasitic voltage-dependent capacitance, the combination of the voltage-dependent resistance and voltage-dependent capacitance for maintaining an essentially constant parasitic component value, independent of changes in the drive current.

* * * * *